United States Patent [19]

Nogami et al.

[11] Patent Number: 5,046,148

[45] Date of Patent: Sep. 3, 1991

[54] ION IMPLANTATION APPARATUS

[75] Inventors: Mamoru Nogami; Nobuo Nagai, both of Kyoto, Japan

[73] Assignee: Nissin Electric Company, Limited, Kyoto, Japan

[21] Appl. No.: 522,786

[22] Filed: May 14, 1990

[30] Foreign Application Priority Data

May 15, 1989 [JP] Japan .................................. 1-122450
Jun. 26, 1989 [JP] Japan .................................. 1-163557

[51] Int. Cl.$^5$ ..................... H01J 37/302; H01J 37/317
[52] U.S. Cl. ................................... 250/492.2; 250/398
[58] Field of Search ............ 250/492.21, 492.2, 492.3, 250/398

[56] References Cited

U.S. PATENT DOCUMENTS 4,733,091 3/1988 Robinson et al. ................. 250/492.2
4,899,059 2/1990 Freytsis et al. .................... 250/492.2
4,922,106 5/1990 Berrian et al. ..................... 250/492.2

Primary Examiner—Jack I. Berman
Attorney, Agent, or Firm—Finnegan, Henderson, Farabow, Garrett, and Dunner

[57] ABSTRACT

In an ion implantation apparatus comprising scanning electrodes for electrically scanning an ion beam in an X direction, a scanning power supply for supplying a scanning power to the scanning electrodes, a drive unit for mechanically scanning a target in a Y direction substantially perpendicular to the X direction, a beam current measurement device disposed at one end section of the scanning area of the ion beam for measuring a beam current of the ion beam, and a control unit for computing the scanning speed of the target based on the beam current measured by the beam current measurement device and for controlling the drive unit so that the target is driven at the computed speed, the control unit outputs a trigger signal whenever the computation process of the scanning speed of the target is completed, and the scanning power supply outputs the scanning power for one reciprocative scanning operation of the ion beam at every time the scanning power supply receives the trigger signal from the control unit.

3 Claims, 4 Drawing Sheets

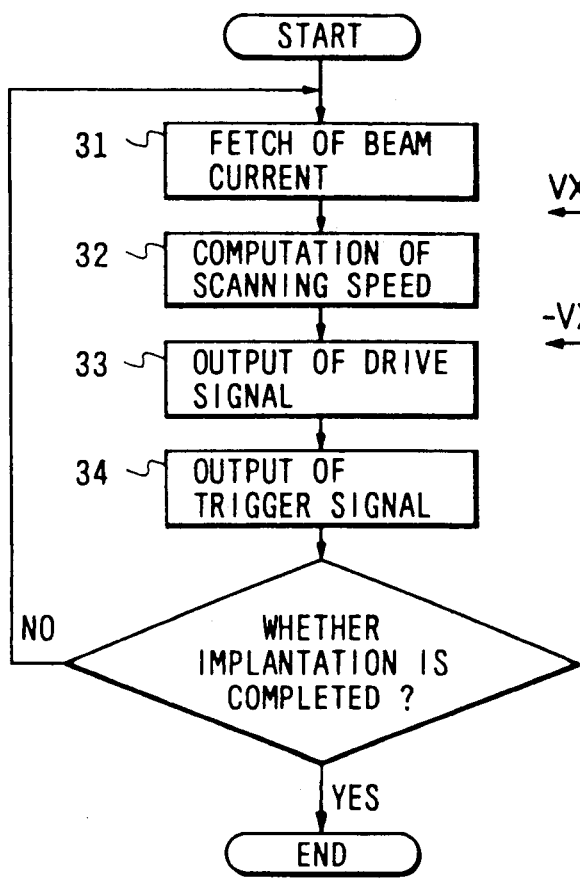
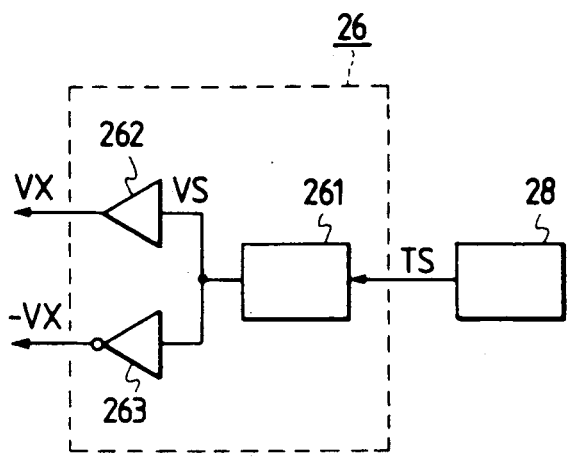
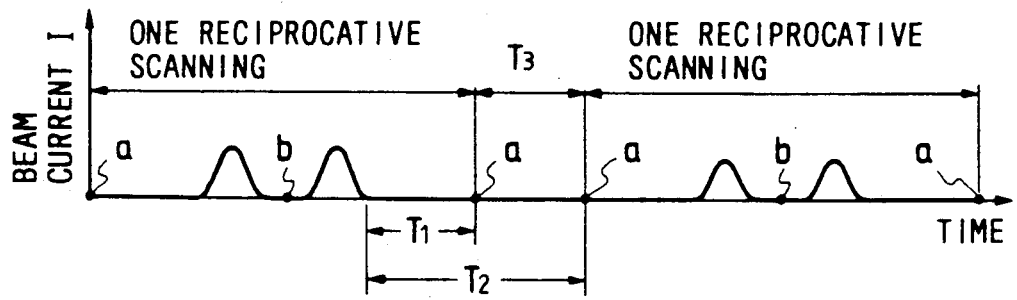

ION IMPLANTATION APPARATUS

BACKGROUND OF THE INVENTION

The present invention relates to a hybrid scan type implantation apparatus in which an ion beam is electrically scanned and a target is mechanically scanned in the direction substantially perpendicular to the scanning direction of the ion beam.

FIG. 1 shows such a type of ion implantation apparatus as a prior art.

In this ion implantation apparatus, a spot shaped ion beam 2 is generated from an ion source after mass analysis, acceleration and so forth are conducted, if necessary. The ion beam 2 is electrostatically scanned in an X direction (for example, a horizontal direction) by a pair of scanning electrodes 4 to which scanning voltages (triangle wave voltages at around 1000 Hz, for example) are supplied from a scanning power supply 6 so that the ion beam 2 is plainly spread in the X direction.

On the other hand, a target 8 (a wafer, for example) is held by a holder 10 in the radiation area of the ion beam 2. The target 8 and the holder 10 are mechanically scanned by a drive unit 12 in a Y direction (for example, in the vertical direction) perpendicular to the X direction. This mechanical scanning operation is associated with the scanning operation of the ion beam 2 so as to equally implant ions into the entire surface of the target 8.

More specifically, at one end section of the scanning area in the X direction of the ion beam 2, a beam current measurement device (for example, a Faraday cup) 14 for measuring the beam current of the ion beam 2 is provided. In this prior art, the beam current I measured by the beam current measurement device is converted into a pulse signal by a converter 16 and the resultant pulse signal is output to a control unit 18. The control unit 18 computes the mechanical scanning speed of the target 8 according to the measured data and controls a drive unit 12 so that it drives the target at the computed speed. More specifically, the drive unit 12 is controlled so that it vertically drives the target 8 at a speed proportional to the beam current I.

In the drive unit 12, for example, a mechanism comprising a linear drive motor, or a combination of a rotation motor and a ball screw can be used.

In the above apparatus, the beam current I measured by the beam current measurement device 14 is as shown in FIG. 2. The points a and b in FIG. 2 correspond to the points a and b in FIG. 1, respectively.

Thus, the control unit 18 must carry out a process of detecting the amount of presently received beam current I, computing the speed of the target 8 necessary for the next reciprocative scanning operation, and outputting a drive signal DS to the drive unit 12 in a time period T1 from the measurement of the previous beam current I to the start of the next reciprocative scanning operation.

However, in the conventional ion implantation apparatus, the time period necessary for one reciprocative scanning operation is approximately 1 msec. The time period T1 is as small as several hundred micro sec. Thus, the control unit 18 should have the performance for executing the computation process described above in such a short time period. In addition, the time period necessary for the computation process varies depending on the amount of the beam current I (for example, as the beam current I increases, the number of process steps in the control unit 18 increases).

If the computation process time period in the control unit 18 exceeds the time period T1, the control operation of the scanning speed of the target 8 would be disordered and thereby the ion implantation operation would be incorrectly executed.

Thus, the control unit 18 must have such a performance that a time period necessary for the longest process is less than T1. However, the control unit 18 having such a high process speed would be very expensive or very difficult to manufacture.

SUMMARY OF THE INVENTION

An object of the present invention is therefore to provide an ion implantation apparatus which can use a control unit whose process speed is slow.

To accomplish the above object, in the ion implantation apparatus according to the present invention, the control unit outputs a trigger signal whenever the computation process of the scanning speed of the target is completed and the scanning power supply outputs a scanning power for one reciprocative scanning operation of the ion beam every time it receives the trigger signal.

According to the above structure, after the computation process in the control unit is completed, the next reciprocative scanning operation of an ion beam is executed. Thus, the control unit whose process speed is slow can be used.

BRIEF DESCRIPTION OF THE DRAWINGS

FIG. 4 is a flow chart showing a rough control operation of a control unit in FIG. 3;

FIG. 5 is a block diagram showing a more specific example of a scanning power supply in FIG. 4;

FIG. 7 is a view showing an example of a beam current measured during the beam scanning operation of the apparatus in FIG. 3;

DETAILED DESCRIPTION OF THE INVENTION

Figure 1:
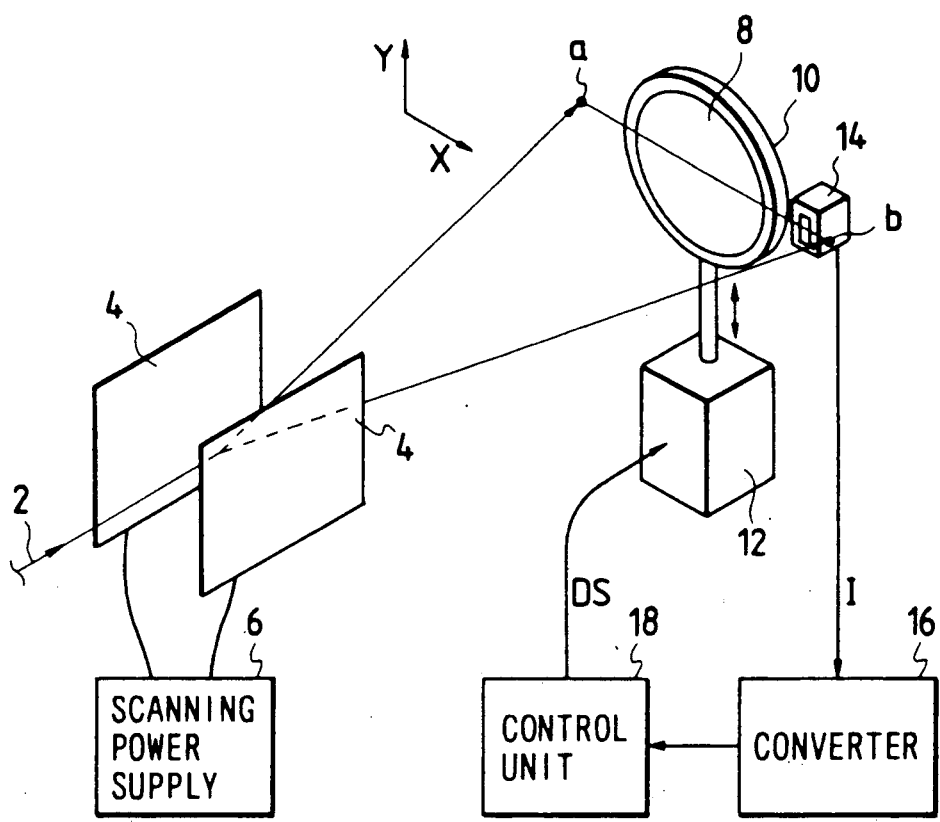
FIG. 1 is a partial view showing an example of an ion implantation apparatus as a prior art.
Figure 3:
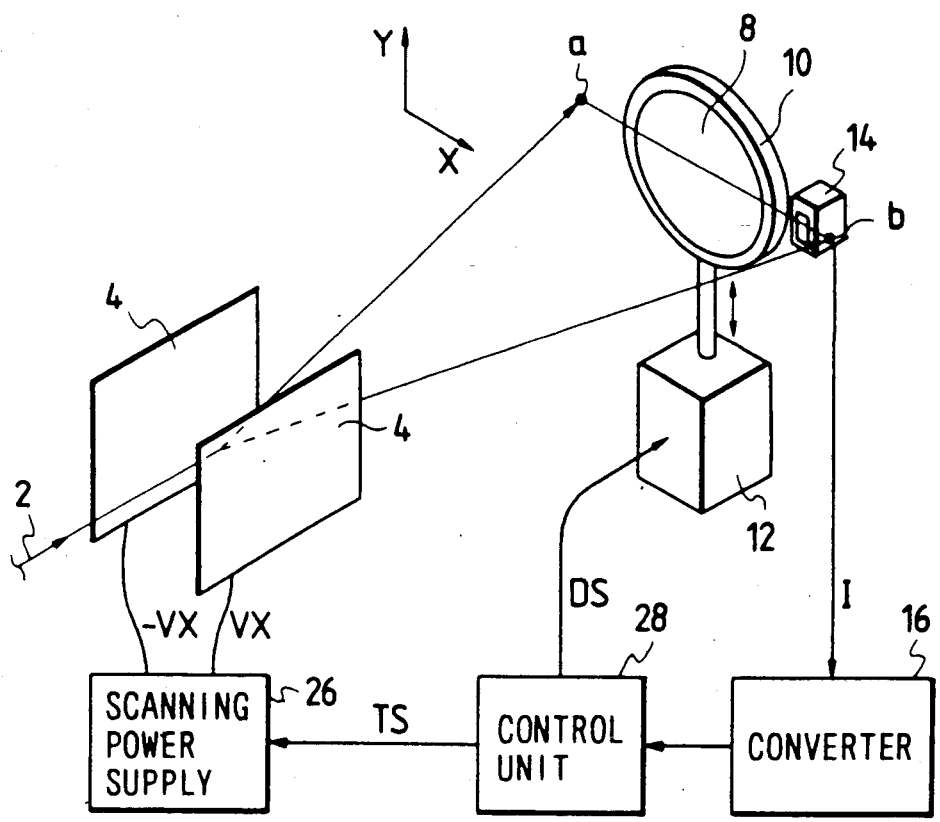
FIG. 3 is a view showing a part of an ion implantation apparatus according to an embodiment of the present invention.

FIG. 3 is a view showing a part of an ion implantation apparatus according to an embodiment of the present invention. The portions corresponding to those in FIG. 1 are designated by the same numerals. The different points from the prior art will be mainly described in the following.

In this embodiment, a control unit 28 corresponding to the control unit 18 outputs a trigger signal TS (see FIG. 6) whenever it completes the computation process of the mechanical scanning speed of the target 8.

More specifically, as shown in FIG. 4, the control unit 28 fetches the beam current I measured by a beam current measurement device 14 (specifically, a pulse signal converted by a converter 16) (in step 31), computes the speed of the target 8 to be driven (scanned) for the next reciprocative scanning operation on the basis of the beam current (in step 32), outputs a drive signal DS to the drive unit 12 (in step 33), and then outputs a trigger signal TS (in step 34). These steps of the process described above are repeated until the specified implantation is completed.

Moreover, in this embodiment, a scanning power supply 26 corresponding to the scanning power supply 6 described above applies a scanning voltage for one reciprocative scanning operation of the ion beam 2 to the pair of the scanning electrodes 4 whenever the trigger signal TS is output from the control unit 28.

Figure 6:
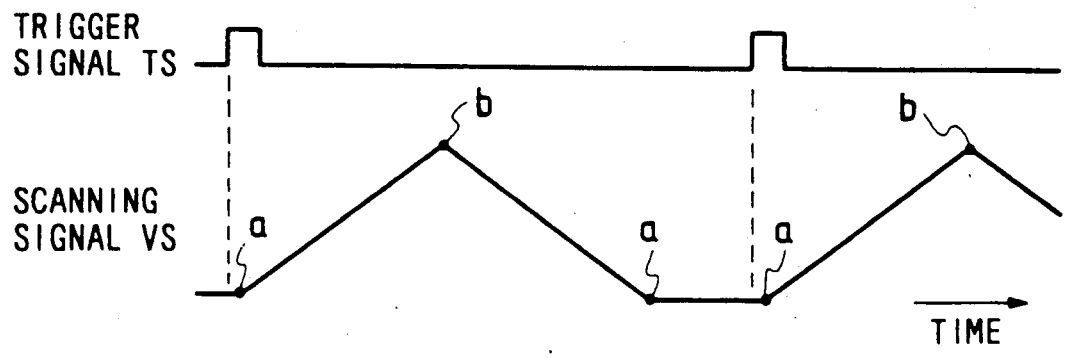
FIG. 6 is a view showing examples of a trigger signal and a scanning signal.

More specifically, for example, as shown in FIG. 5, the scanning power supply 26 comprises a signal generator 261 for generating a triangle wave scanning signal VS and high voltage amplifiers 262 and 263 for raising the voltage of the scanning signal VS and for outputting reverse polarity scanning voltages VX and $-$VX, respectively. As shown in FIG. 6, the signal generator 261 outputs one triangle wave whenever the trigger signal TS is input from the control unit 28. For this purpose, for example, a well known arbitrary waveform generator can be used. The points a and b in FIG. 6 correspond to the points a and b in FIGS. 3 and 7.

According to the structure described above, after the computation process in the control unit 28 is completed, the trigger signal TS is output. In response to the trigger signal, the next reciprocative scanning operation of the ion beam 2 is executed. Thus, the control unit 29 whose process speed is slow can be also used.

Figure 2:
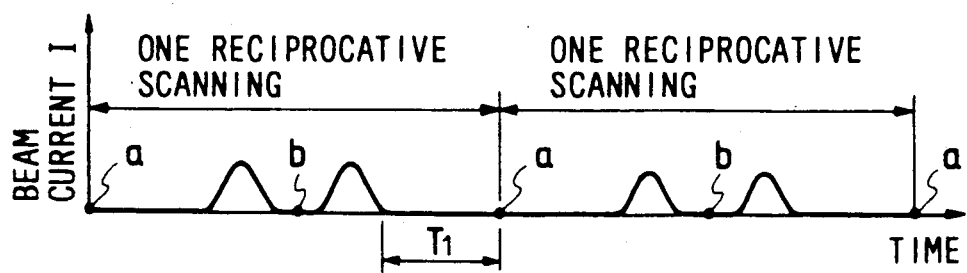
FIG. 2 is an example of a beam current measured during the beam scanning operation of the apparatus in FIG. 1.

More specifically, as shown in FIG. 7, assuming that the computation process time period of the control unit 28 is T2, the next scanning operation of the ion beam 2 is started after time period T2 has elapsed since the preceding beam current I was measured. Thus, even if the time period T2 exceeds the time period T1 described in FIG. 2, no fatal error such as a disorder of control of implantation occurs at all as opposed to the conventional apparatus. Only a loss time period T3 ($=$T2$-$T1) arises instead.

During this loss time period T3, the implantation operation to the target 8 is not executed. However, this loss time is normally as small as the order of micro sec. Thus, even if the loss time period T3 occurs, the time period necessary for implanting the specified dose amount of ions is slightly longer than that of the conventional apparatus. Thus, no special problem arises.

In the above embodiment, as the scanning means of the ion beam 2, the scanning electrodes 4 are used. However, it is also possible to use deflection magnets for scanning the ion beam 2 by a magnetic field in the same manner described in the above embodiment. In this case, as the scanning output from the scanning power supply, a triangle wave scanning current is supplied.

Further, instead of the above described linear movement, swing rotation may be used for mechanically driving the target 8 in the Y direction substantially perpendicular to the X direction of the scanning direction of the ion beam 2.

Figure 8:
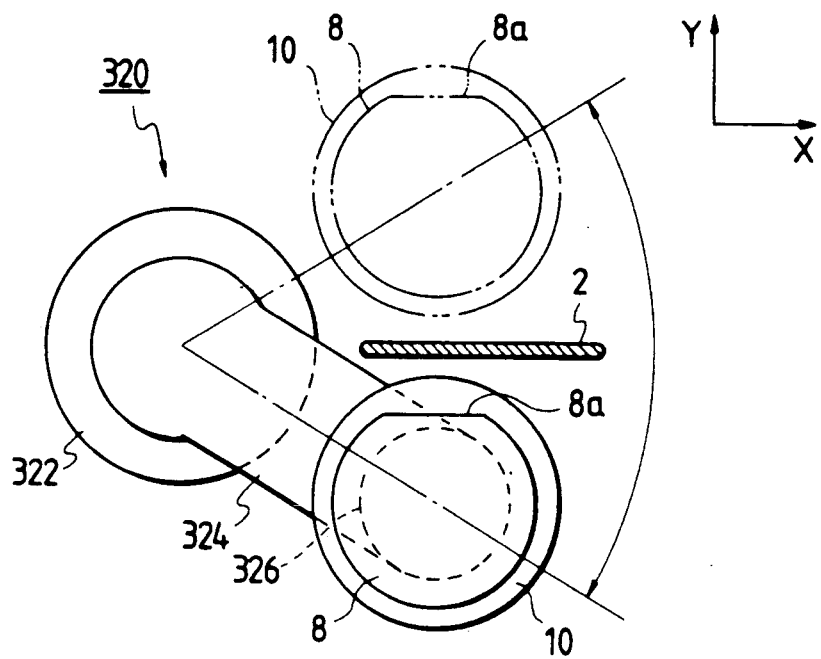
FIG. 8 is a view showing an example of a drive unit for driving a target.

A drive unit 320 as shown in FIG. 8 is an example of such a drive means.

The drive unit 320 comprises an arm 324 for supporting a holder 10, and a reversibly rotatable motor 322 (for example, direct drive motor) for rotating the arm 324 as shown by an arrow in FIG. 8. The reciprocating rotation of the motor 322 causes the target 8 held by the holder 10 to be mechanically scanned in the Y direction substantially perpendicular to the X direction in an arc shape while the target 8 is faced to the ion beam 2.

In this case, in order to maintain the posture of the target 8 (for example, the direction of the orientation flat 8a) at the scanning of the target 8, means for rotating the holder 10 in accordance with the rotation of the arm 324 may be provided. For example, as in this example, a reversibly rotatable motor (for example, direct drive motor) 326 is fixed to the arm 324, the holder 10 is fixed to the output shaft of the motor 326, and the holder 10 is rotated by the motor 326 by the same angle in the reverse direction to the rotation direction of the arm 324. Thus, the posture of the target 6 can be maintained.

Further, the ion beam 2 converted into a parallel beam by electrically scanning the beam in the X direction may be irradiated to the target 8.

Figure 9:
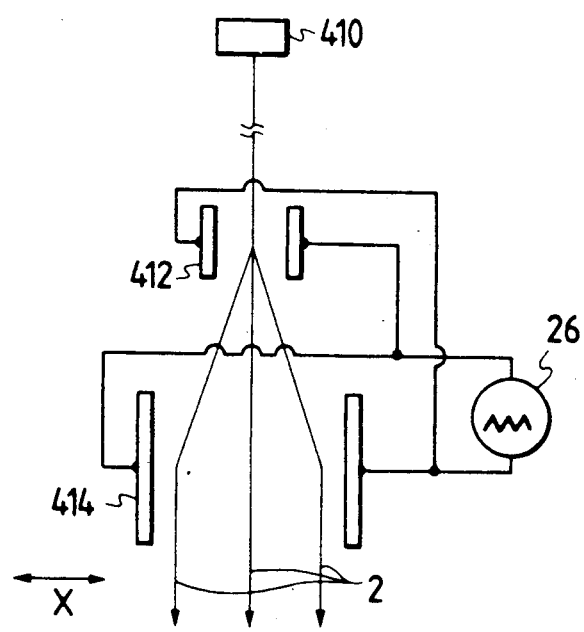
FIG. 9 is a view showing an example of an electrical scanning means for scanning an ion beam.

FIG. 9 shows an example of such a scanning means of the ion beam 2. The ion beam 2 extracted from an ion source 410, and subjected to mass analysis, acceleration and the like, if necessary, is scanned in the X direction by cooperation of the two pairs of scanning electrodes 412 and 414, to which reverse polarity scanning voltages (triangular wave voltages) are applied from the same scanning power source 26, so that the beam exiting from the scanning electrode 414 is converted into the parallel beam. The ion beam 2 may be converted into the parallel beam by using magnetic field rather than electric field of this example.

Moreover, in this disclosure, the X direction and the Y direction only refer to two directions, one of which is perpendicular to the other. Thus, it is possible to consider the X direction as the horizontal direction, the vertical direction, or any inclined direction thereto.

As described above, according to the present invention, after the specified computation process in the control unit is completed, the next reciprocative scanning operation of the ion beam is executed. Thus, the control unit whose process speed is slow can be also used.

Thus, the cost of the control unit can be decreased and no difficulty for manufacturing it arises.

What is claimed is:

1. An ion implantation apparatus, comprising:
   scanning means for electrically scanning an ion beam in and X direction;
   a scanning power supply for supplying a scanning power to said scanning means;
   a drive unit for mechanically scanning a target in a Y direction substantially perpendicular to said X direction;
   a beam current measurement device disposed at one end section of a scanning area of said ion beam for measuring a beam current of said ion beam; and
   a control unit for computing a scanning speed of said target based on said beam current measured by said beam current measurement device and for controlling said drive unit so that said target is driven at the computer speed;
   wherein said control unit outputs a trigger signal whenever the computation process of said scanning speed of said target is completed, and said scanning power supply outputs said scanning power for one reciprocative scanning operation of said ion beam at every time said scanning power supply receives said trigger signal from said control unit; and wherein said drive unit comprises an arm for supporting a holder for holding said target, and a reversibly rotatable motor for rotating said arm so that said target is scanned in an arc form while said target faces to said ion beam.

2. An ion implantation apparatus as claimed in claim 1 further comprising means for converting said ion beam into a parallel beam.

3. An ion implantation apparatus, comprising:

scanning means for electrically scanning an ion beam in an X direction;

a scanning power supply for supplying a scanning power to said scanning means;

a drive unit for mechanically scanning a target in a Y direction substantially perpendicular to said X direction, said drive unit comprising an arm for supporting a holder for holding said target, and a reversibly rotatable motor for rotating said arm so that said target is scanned in an arc form while said target faces said ion beam;

a beam current measurement device disposed at one end section of a scanning area of said ion beam for measuring a beam current of said ion beam; and a control unit for computing a scanning speed of said target based on said beam current measured by said beam current measurement device and for controlling said drive unit so that said target is driven at the computer speed and its posture is maintained.

* * * * *

UNITED STATES PATENT AND TRADEMARK OFFICE
CERTIFICATE OF CORRECTION

PATENT NO. : 5,046,148
DATED : September 03, 1991
INVENTOR(S) : Mamoru Nogami et al.

It is certified that error appears in the above-identified patent and that said Letters Patent is hereby corrected as shown below:

Claim 1, column 4, line 49, after "in" change "and" to --an--.

Claim 1, column 4, line 62, change "computer" to --computed--.

Claim 3, column 6, line 15, change "computer" to --computed--.

Signed and Sealed this

Eighth Day of June, 1993

Attest:

MICHAEL K. KIRK

*Attesting Officer*  *Acting Commissioner of Patents and Trademarks*